US009513355B2

United States Patent
Ritter (10) Patent No.: US 9,513,355 B2
(45) Date of Patent: Dec. 6, 2016

(54) CONTROLLING A MAGNETIC RESONANCE SYSTEM

(71) Applicant: Dieter Ritter, Fürth (DE)

(72) Inventor: Dieter Ritter, Fürth (DE)

(73) Assignee: Siemens Aktiengesellschaft, München (DE)

( * ) Notice: Subject to any disclaimer, the term of this patent is extended or adjusted under 35 U.S.C. 154(b) by 834 days.

(21) Appl. No.: 13/872,101

(22) Filed: Apr. 27, 2013

(65) Prior Publication Data

US 2013/0285660 A1   Oct. 31, 2013

(30) Foreign Application Priority Data

Apr. 27, 2012  (DE) .................. 10 2012 207 132

(51) Int. Cl.
*G01R 33/54*   (2006.01)
*G01R 33/36*   (2006.01)
(Continued)

(52) U.S. Cl.
CPC ......... *G01R 33/543* (2013.01); *G01R 33/3607* (2013.01); *G01R 33/246* (2013.01); *G01R 33/5612* (2013.01); *G01R 33/586* (2013.01)

(58) Field of Classification Search
CPC ... G01R 33/246; G01R 33/543; G01R 33/586; G01R 33/3607; G01R 33/5612
See application file for complete search history.

(56) References Cited

U.S. PATENT DOCUMENTS 4,866,386 A * 9/1989 Sattin .................. G01R 33/54
                                                324/312
5,619,138 A * 4/1997 Rourke ................ G01R 33/446
                                                324/309
(Continued)

FOREIGN PATENT DOCUMENTS

CN  101612042 A  12/2009
CN  102210587 A  10/2011
(Continued)

OTHER PUBLICATIONS

Chinese Office action for related Chinese Application No. 201310142210X, dated Jul. 15, 2015, with English Translation.
(Continued)

*Primary Examiner* — Dixomara Vargas
(74) *Attorney, Agent, or Firm* — Lempia Summerfield Katz LLC (57) ABSTRACT

A method for controlling a magnetic resonance system is provided. The magnetic resonance system includes a plurality of radio-frequency transmit channels via which, in operation, parallel RF pulse trains are transmitted. The method includes specifying a common reference pulse train for the plurality of the radio-frequency transmit channels. The method also includes, determining, in an RF pulse optimization method, taking into account a prespecified target magnetization, a transmit scaling factor for each of the radio-frequency transmit channels in order to calculate the RF pulse trains for the transmit channels on the basis of the reference pulse train. The transmit scaling factors are optimized taking into account a component-induced $B_1$ field maximum value that is dependent upon the transmit scaling factors.

20 Claims, 5 Drawing Sheets

(51) Int. Cl.
  *G01R 33/24* (2006.01)
  *G01R 33/561* (2006.01)
  *G01R 33/58* (2006.01)

(56) References Cited

U.S. PATENT DOCUMENTS

| | | | |
|---|---|---|---|
| 5,914,599 A | 6/1999 | Sharp | |
| 6,275,040 B1 * | 8/2001 | Zur | G01R 33/446 324/320 |
| 6,448,769 B1 * | 9/2002 | Rosenfeld | G01R 33/446 324/307 |
| 6,624,629 B1 * | 9/2003 | Speier | G01R 33/4608 324/303 |
| 6,750,649 B1 * | 6/2004 | Rosenfeld | G01R 33/446 324/307 |
| 6,831,459 B2 * | 12/2004 | Szyperski | G01R 33/4633 324/309 |
| 7,303,557 B2 * | 12/2007 | Wham | A61B 18/1442 606/34 |
| 7,364,577 B2 * | 4/2008 | Wham | A61B 18/00 606/34 |
| 7,365,539 B2 * | 4/2008 | Szyperski | G01R 33/4633 324/309 |
| 7,385,396 B2 * | 6/2008 | Zhu | G01R 33/288 324/307 |
| 7,439,738 B2 * | 10/2008 | Pines | G01R 33/36 324/307 |
| 7,880,468 B2 * | 2/2011 | Szyperski | G01R 33/4633 324/309 |
| 8,102,177 B2 * | 1/2012 | McKinnon | G01R 33/288 324/307 |
| 8,287,528 B2 * | 10/2012 | Wham | A61B 18/00 606/34 |
| 8,508,227 B2 * | 8/2013 | Haas | G01R 33/3415 324/307 |
| 8,633,695 B2 * | 1/2014 | Ouwerkerk | A61B 5/055 324/309 |
| 9,140,769 B2 * | 9/2015 | van Zijl | G01R 33/5601 |
| 2010/0127703 A1 | 5/2010 | Sung et al. | |
| 2010/0308825 A1 | 12/2010 | Brinker et al. | |
| 2011/0241680 A1 | 10/2011 | Mossnang et al. | |
| 2011/0254545 A1 | 10/2011 | Gebhardt et al. | |
| 2011/0254546 A1 | 10/2011 | Ritter | |
| 2012/0019247 A1 | 1/2012 | Boernert et al. | |
| 2013/0038326 A1 | 2/2013 | Amadon et al. | |

FOREIGN PATENT DOCUMENTS

| | | |
|---|---|---|
| DE | 102010015044 A1 | 10/2011 |
| DE | 102010015066 A1 | 10/2011 |
| DE | 102011007823 A1 | 10/2012 |
| EP | 2378307 A1 | 10/2011 |
| WO | WO2011113131 A1 | 9/2011 |
| WO | WO2011128847 A1 | 10/2011 |
| WO | WO 2012143368 A1 | 10/2012 |

OTHER PUBLICATIONS

German Office Action dated Mar. 5, 2013 for corresponding German Patent Application No. DE 10 2012 207 132.6 with English translation.

Grissom et al., "Spatial Domain Method for the Design of RF Pulses in Multicoil Parallel Excitation", Magnetic Resonance in Medicine, 56, pp. 620-629, (2006).

R. Gumbrecht et al; "Fast High-Flip pTx Pulse Design to Mitigate B1+ Inhomogeneity Using Composite Pulses at 7T"; Proc. ISMRM; p. 101, (2010).

J. Lee et al; "Local SAR in Parallel Transmission Pulse Design"; Magnetic Resonance in Medicine, vol. 67, pp. 1566-1578, (2012).

A. B. Kerr et al, "Dual-band RF Shimming at High-Field with Parallel Excitation", Proc. Intl. Soc. Mag. Reson. Med., vol. 16, p. 617, (2008).

* cited by examiner

CONTROLLING A MAGNETIC RESONANCE SYSTEM

This application claims the benefit of DE 10 2012 207 132.6, filed on Apr. 27, 2012, which is hereby incorporated by reference.

BACKGROUND

The present embodiments relate to a method for controlling a magnetic resonance system having a plurality of radio-frequency transmit channels.

In a magnetic resonance system or magnetic resonance tomography system, the body to be examined may be exposed to a relatively high basic magnetic field (e.g., the "$B_0$ field") of 3 or 7 tesla, for example, with the aid of a basic field magnet system. A gradient system is also used to apply a magnetic field gradient. Radio-frequency excitation signals (RF signals) are emitted via a radio-frequency transmit system using suitable antenna facilities with the aim of tipping the nuclear spins of certain atoms that have been excited in a resonant manner by this radio-frequency field (e.g., the "$B_1$ field") with spatial resolution through a defined flip angle in relation to the magnetic field lines of the basic magnetic field. This radio-frequency excitation or the resulting flip angle distribution are hereinafter also referred to as nuclear magnetization or "magnetization". The relationship between the magnetization m and the $B_1$ field emitted over a period T is obtained according to $$m \approx 2\pi\gamma \cdot \int_{t=0}^{T} B_1(t)\,dt \quad (1)$$

$\gamma$ is the gyromagnetic moment, t the time variant, and $B_1(t)$ is the time-varying magnetic field strength of the $B_1$ field. On the relaxation of nuclear spins, radio-frequency signals (e.g., magnetic resonance signals) are emitted, received by suitable receive antennas, and further processed. The raw data acquired in this way may be used to reconstruct the desired image data. The emission of the radio-frequency signals for nuclear spin magnetization may take place by a "whole body coil" or "body coil" or also by of local coils placed on the patient or test subject. A typical structure of a whole body coil is a birdcage antenna including a plurality of transmit rods arranged parallel to the longitudinal axis around a patient chamber of the tomography system in which a patient is present during the examination. The end faces of the antenna rods are interconnected in a capacitive manner in a ring.

Whole body antennas may be operated in a "CP mode" (circularly polarized mode). A single temporal RF signal is sent to all components of the transmit antenna (e.g., all transmit rods of a birdcage antenna). In this case, the transfer of the pulses with identical amplitudes to the individual components may take place with a phase offset with a displacement matched to the geometry of the transmit coil. For example, in the case of a birdcage antenna with 16 rods, the rods are each activated with the same HF magnitude signal with 22.5° phase displacement. The result is a circularly polarized radio-frequency field in the x-/y plane (e.g., perpendicular to the longitudinal axis of the birdcage antenna extending in the z direction).

The radio-frequency signal may be modified to be emitted (e.g., the incoming sequence of radio-frequency pulses) individually with respect to amplitude and phase by a complex transmit scaling factor. In this case, the $B_1$ field at a location r (e.g., at a pixel or voxel position r, where r is a vector with the values of the Cartesian coordinates x, y, z in mm) is represented by $$B_1(t) = \sum_{c=1}^{N} E_c(r) \cdot b_c(t) \quad (2)$$

In this case, $b_c(t)$ is a RF curve to be transmitted on the channel c=1, . . . , N (e.g., the voltage amplitude distribution pattern (in V) of an RF pulse train over time t, which is specified by $b_c(t)=SF_c \cdot b_R(t)$, where $SF_c$ is the complex scaling factor for the channel c, and $b_R(t)$ is the voltage distribution pattern of the reference pulse train). $E_c(r)$ is the sensitivity (in µT/V) of the antenna element of the radio-frequency transmit channel c at a specific location r (e.g., the pixel or voxel position). $E_c(r)$ is the position-dependent sensitivity distribution in the form of a sensitivity matrix.

The antenna may be operated in "CP mode" in that the amplitude is selected at the same level for all transmit channels, and a phase shift matched to the geometry of the transmit coil is provided. In addition, depending upon the object to be examined, an "EP mode" (elliptically polarized mode) with which the radio-frequency field in the x-/y plane is not circularly polarized, but elliptically polarized may be used. The mode used may be determined by the shape of the body area to be excited. In the case of objects that may be cylindrically symmetrical (e.g., in the case of images of the head region), the CP mode may be selected. In the case of more elliptical shapes (e.g., examinations in the thoracic or abdominal regions), the EP mode is chosen. The object of the EP mode is to compensate inhomogeneities of the $B_1$ field caused by non-circularly symmetrical body shapes. "$B_1$ shimming" of a multi-channel radio-frequency transmit system may be performed. The individual transmit scaling factors are calculated on the basis of a patient-specific adjustment generally with the aim of calculating a particularly homogeneous excitation compared to the previous standard CP or EP mode.

In this case, the transmit scaling factors are calculated by optimizers that minimize the magnitude deviation of the perfectly homogeneously desired target magnetization m of the theoretically achieved actual magnetization A·b:

$$b = \arg_b \min(\|A \cdot b - m\|^2) \quad (3)$$

A is the design matrix including a system of complex linear equations into which the spatial transmit profiles of the individual transmit channels (e.g., antenna rods) and the present $B_0$ field distribution are inserted. This design matrix is, for example, described in W. Grissom et al.: "Spatial Domain Method for the Design of RF Pulses in Multicoil Parallel Excitation", Mag. Res. Med. 56, 620-629, 2006. b(t) is the vector of the RF curves Mt) to be transmitted in parallel. If the solution to Equation (3) (e.g., the minimum of the "target function" defined in Equation (3)) is found, $SF_1, SF_2, \ldots, SF_N$ are available as the result of the desired scaling factors.

In the case of a plurality of measurements or examinations, the "$B_1$ performance" is a further criterion. In this case, the object is to achieve a specific target magnetization m as efficiently as possible (e.g., quickly) at a specific location (e.g., in a specific region of interest (ROI)). According to Equation (1), it is advantageous to achieve the highest possible $B_1$ field. In order to increase the $B_1$ field, according to Equation (2), the voltage distribution patterns $b_c$ may be increased (e.g., the voltage amplitudes of the RF pulses).

Purely for technical reasons, this is not automatically possible since the individual components located in the transmit chain of the magnetic resonance system such as, for example, RF amplifiers, cables, measuring devices, and adapter networks are to be protected against overvoltage. Therefore, on the transmission of a pulse train, the pulse train is first checked with regard to the voltage compatibility with respect to the relevant components, and hence, the voltage of the pulse train Mt) is limited. For example, this problem occurs with $B_1$ shimming since due to the complex scaling factors $SF_1$, $SF_2$, ..., $SF_N$ on adjacent channels c, transmitted pulse trains Mt) are not only scaled in amplitude, but may also be phase-shifted with respect to each other, so that voltage differences that are higher than the maximum amplitude of the individual pulse trains Mt) may occur between these channels.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an alternative control method and a suitable pulse optimization apparatus providing $B_1$ shimming, in which the $B_1$ performance may be improved at least locally, are provided.

In a method for controlling a magnetic resonance system including, for example, a plurality of independently controllable, radio-frequency transmit channels via which, in operation, the parallel RF pulse trains are transmitted, a common reference pulse train is specified for a plurality of the radio-frequency transmit channels (e.g., all the radio-frequency transmit channels). In an RF pulse optimization method taking into account a prespecified target magnetization, an individual complex transmit scaling factor is determined for each of the radio-frequency transmit channels in order to calculate the RF pulse trains for the transmit channels on the basis of the reference pulse train (e.g., as explained above for scaling or multiplication with the reference pulse train for the radio-frequency transmit channel in question).

In one embodiment, in the RF pulse optimization method, the transmit scaling factors are optimized taking into account a component-induced $B_1$ field maximum value that is dependent upon the transmit scaling factors. "Component-induced $B_1$ field maximum value" (hereinafter also "$B_1$ field maximum value") may be a $B_1$ field maximum value that is caused by the fact that the transmit components (TX-components) in the RF transmission path of the magnetic resonance system are limited with respect, for example, to a maximal permissible voltage (e.g., also a differential voltage between adjacent channels). Above this voltage, there may, for example, be an impairment of the function of or even damage to the respective TX component. As described below, there are various possibilities for taking account of and defining the $B_1$ field maximum value in the context of the RF pulse optimization method. Depending upon the specific application, this enables, for example, specific minimum requirements for the $B_1$ performance to be adhered to, and/or the target magnetization is achieved efficiently in a specific local area.

A suitable pulse optimization apparatus for a magnetic resonance system that includes a plurality of radio-frequency transmit channels is thus to be embodied to optimize the transmit scaling factors taking into account a component-induced $B_1$ field maximum value that is dependent upon the transmit scaling factors in the RF pulse optimization method.

In addition to the plurality of radio-frequency transmit channels and the further system components such as, for example, a gradient system, a basic field magnet and a control apparatus embodied to emit parallel RF pulse trains in order to perform a desired measurement over the radio-frequency transmit channels, one embodiment of a magnetic resonance system also includes a pulse optimization apparatus. The pulse optimization apparatus may, for example, be part of the control apparatus of the magnetic resonance system. The pulse optimization apparatus may, however, also be located in an external computer, connected, for example, via a network to the control apparatus (e.g., an operator terminal or another computer) to swap out compute-intensive processes.

In one embodiment, at least most of the parts of the pulse optimization apparatus are embodied in the form of software. A computer program that may be loaded directly into a memory of a pulse optimization apparatus and/or a control apparatus with program code portions in order to execute all acts of the method when the program is executed in the pulse optimization apparatus and/or a control apparatus is also provided. A software implementation of this kind has the advantage that previous configurations, which are used to determine transmit scaling factors or for $B_1$ shimming (e.g., control devices in existing magnetic resonance systems) may also be modified by implementing the program in a suitable way in order to perform $B_1$ shimming in a way according to the one or more of the present embodiments.

The description of one category (e.g., method) may be further developed in analogy with the description of another category (e.g., apparatus).

With one embodiment of the method, in the RF pulse optimization method, during the calculation of the transmit scaling factors, at least in a first optimization mode, a target function that in some way takes direct account of $B_1$ field maximum value is created. For example, the target function may include the $B_1$ field maximum value as a function term (e.g., as a factor or summand), optionally also weighted in a suitable way or with freely selectable weighting.

In one embodiment, the transmit scaling factors are optimized such that the $B_1$ field maximum value $<B_1>_{max}$ is maximized. This is, for example, provided by a target function $$SF = \arg_{SF} \max\{\langle B_1 \rangle_{max}\} \quad (4)$$

SF is the vector of the individual complex scaling factors $SF_1$, $SF_2$, ..., $SF_N$. In other words, the solution to equation (4) also provides the scaling factors $SF_1$, $SF_2$, ..., $SF_N$ with which the $B_1$ field maximum value $<B_1>_{max}$ is maximum.

As in the example of Equation (4), the target function may be created independently of a target magnetization deviation and/or an RF load value of an object to be examined.

As explained above with reference to Equation (1), optimization may have been performed such that the target magnetization deviation is minimized in the target function. In addition, a suitable further function term in the target function may reduce the radio-frequency exposure (RF exposure) on the patient. The RF exposure is to be limited since excessive RF exposure may cause harm to the patient. Therefore, the RF exposure on the patient is calculated in advance while planning the radio-frequency pulses to be emitted, and the radio-frequency pulses are selected such that a specific limit is not reached. In this case, in the following, RF exposure may be understood to be physiological exposure induced by the RF irradiation and not the introduced RF energy as such. A typical measure for the RF exposure is the specific absorption rate (SAR) value that indicates in watt/kg the biological exposure acting on the patient as the result of a specific RF pulse power. For example, the global RF exposure of a patient is deemed to be a standardized limit of 4 watt/kg in the "first level" according to the IEC standard. Since, with the individually controllable transmit channels, the RF exposure may vary greatly locally, the target function may also include monitoring of the local RF exposure, with which the RF exposure is calculated theoretically at specially defined "virtual observation points" (VOPs). Local RF exposure may not be the RF amplitude that occurs at a location or in a specific volume unit, but the energy load resulting therefrom or the physiological load induced by the RF irradiation (e.g., in the form of a specific energy dose (SED) value or of the SAR value in a specific local volume (e.g., at the VOPs). The RF local exposure value may, for example, be based on one or more local SAR values or SED values. This is, for example, described for a free individual determination of the radio-frequency pulses $b_c(t)$ in DE 10 2010 015 044 A1, to which reference may be made in the following with respect to the calculation of VOPs (e.g., "hot spots"). A possibility for taking account of the radio-frequency exposure in the target function is to expand the target function by the Tikhonov regularization, with which solutions for small vectors b that include the smallest possible radio-frequency amplitudes may be provided. Since the radio-frequency voltage is entered squared into the calculation of the output power, the radio-frequency exposure (RF exposure) of the patient may be reduced in this way.

In order not to leave the target magnetization deviation and/or the RF load value in the RF pulse optimization method completely out of account, in one variant, these criteria or at least one of the criteria are taken into account by a boundary condition function instead of in the target function.

The target function and the boundary condition function are formulated in a suitable way and use a "solver (e.g., an optimization program) to solve the target function, which is also capable of taking boundary condition functions into account. "Constrained solvers" of this kind are known to the person skilled in the art. A suitable program module with a constrained solver of this kind is, for example, the interior point subalgorithm of the "fmincon" optimizer from Mathwork Optimization Toolbox from The Mathworks Inc., Natick (USA). Any other constrained solvers may also be used.

A plurality of boundary condition functions or a boundary condition function formulated from a plurality of partial boundary condition functions may be taken into account in order, for example, to take account of both the current target magnetization deviation and the radio-frequency exposure.

In one embodiment, the RF load value taken into account in the boundary condition function may be an RF local exposure value with which the radio-frequency exposure present locally in a specific location is taken into account, as above, for example, with reference to DE 10 2010 015 044 A1. This, however, does not exclude the possibility that instead a global RF load value (e.g., averaged over the entire body of the patient or a combined RF load value) that takes into account both the RF local exposure value and a global load value is used in the boundary condition function in the RF pulse optimization method.

The boundary condition function is selected such that the boundary condition defines a permissible deviation of a parameter value of at least one specific parameter from a relative reference parameter value. For example, if the target magnetization deviation is taken into account in the boundary condition function, the parameter value may be the current target magnetization deviation. In this case, the maximum deviation of the target magnetization deviation from a relative reference target magnetization deviation is defined.

If the radio-frequency load value is to be taken into account in the boundary condition function, correspondingly the maximum deviation of the RF load value from a relative reference RF load value is defined.

In this case, a deviation from zero may be specified in each case (e.g., the relative reference parameter value specified in the boundary condition function is to be exactly adhered to). In one embodiment, a specification according to which, for example, a parameter value of the parameter monitored in the boundary condition function reached in the optimization method is to be below the reference parameter value may, however, be provided.

A relative reference parameter value (e.g., the relative reference target magnetization deviation or the relative reference-RF load value) may be a value that, for example, may relate to a different operating mode of the magnetic resonance system. In the context of $B_1$ shimming, only scaling factors are determined. The actual target magnetization and the RF exposure are, however, still dependent upon the reference pulse train that is non-variable in $B_1$ shimming. Therefore, the reference parameter value may be defined on the basis of a parameter value of the parameter in question in a basic excitation mode. "Basic excitation mode" may be understood to be the standard mode used in each case for the examination in question according to the previous method without $B_1$ shimming (e.g., with a head examination, the CP mode and, with an abdomen examination, the EP mode). In other words, there is a comparison with values that may be achieved with radio-frequency pulse trains on the transmit channels that are based on the same reference pulse train, but with transmit scaling factors corresponding to the basic excitation mode for the examination in question.

In one embodiment, before or at the start of the RF pulse optimization method, a relation value may be acquired and, on the basis of this, the reference parameter value then defined relative to the parameter value of the parameter in question achievable in the basic excitation mode. A relation value of this kind may, for example, be a factor or a percentage in order to define to what degree a specific relative reference parameter value is to be achieved. Therefore, for example, the relation value with the aid of the boundary condition may specify that, in the case of a measurement in the head area, which would otherwise be performed in the CP mode, the $B_1$ shimming may be performed such that the target magnetization is achieved at least to the same degree as in the CP mode. Alternatively or additionally, it may be specified that the RF exposure is to be lower by a specific percentage (e.g., 40%) than with a usual CP mode.

In one embodiment, the pulse optimization apparatus is configured such that the pulse optimization apparatus may be operated at least in a second optimization mode. In the second optimization mode, the $B_1$ field maximum value is taken into account in a boundary condition function and is, for example, no longer taken into account in the target function. In this mode, therefore, the target function may, for example, be established as in the conventional optimization methods and, for example, the target magnetization deviation and/or a RF load value may be taken into account directly in the target function.

In one embodiment, the transmit scaling factors are optimized such that the $B_1$ field maximum value lies at least above a specific reference maximum value. Alternatively, the $B_1$ field maximum value may correspond exactly to the prespecified reference maximum value.

Like the above-explained relative reference parameter value, the reference maximum value may also be a relative reference maximum value that may, for example, relate to another operating mode of the magnetic resonance system. It is also applicable for the maximum $B_1$ field that, in the context of $B_1$ shimming, only scaling factors are determined, and the $B_1$ field that is actually present later is still dependent upon the reference pulse. The reference maximum value may, therefore, be defined on the basis of the $B_1$ field maximum value reached in a basic excitation mode. The above-explained definition may apply for the basic excitation mode. In one embodiment, a suitable relation value may be specified for the determination of the reference maximum value. With the relation value, what the achievable proportion is to be of a same $B_1$ field maximum value as in the basic excitation mode may be determined.

In one embodiment, before or at the start of the RF pulse optimization method, an optimization mode indicator is acquired and, on the basis thereof, the RF pulse optimization method is performed according to the first optimization mode, the second optimization mode, or possibly according to a further optimization mode. This optimization mode indicator may, for example, be acquired via a suitable interface of the pulse optimization apparatus or the control apparatus of the magnetic resonance system. For example, this may involve a user interface via which an operator may specify the optimization mode indicator. Alternatively, the optimization mode indicator may be specified by a control protocol that also contains the majority of other parameters for a measurement to be performed and is automatically executed gradually during the course of the measurement.

The further optimization modes may, for example, involve optimization modes in which the $B_1$ field maximum value is taken into account in the target function and also further parameters (e.g., the target magnetization deviation and/or the RF load value or optimization modes in which the $B_1$ field maximum value is taken into account in the target function and in a boundary condition). Similarly, further optimization modes that do not take account of the $B_1$ field maximum value may be provided.

The $B_1$ field maximum value may be calculated using at least one component protection model function. For a specific TX component in the radio-frequency transmission chain of a radio-frequency transmission channel of the magnetic resonance system, a component protection model function of this kind represents a maximum permissible voltage. Specific model assumptions are used as a basis. Possibilities for defining component protection model functions of this kind are described in more detail below with reference to the exemplary embodiments. Component protection model functions of this kind enable the appropriate $B_1$ field maximum value to be calculated or at least estimated very well for each magnetic resonance system individually taking into account the TX components and the interconnection used in the respective system.

In one embodiment, the $B_1$ field maximum value is also calculated using position-dependent sensitivity distributions $E_c(r)$ of the radio-frequency transmit channels, as mentioned above in connection with Equation (2). The position-dependent sensitivity distributions $E_c(r)$ describe the sensitivity of the antenna element assigned in each case to the radio-frequency transmit channel in question at the location r.

Since the $B_1$ field maximum value may be set as a function of the location r, the $B_1$ field maximum value may be calculated for a locally restricted area. If the $B_1$ field maximum value is only calculated for a locally restricted area, accordingly only an optimization taking into account the respective local $B_1$ field within a specific area may take place (e.g., only for the pixels or voxels within a region of interest). In this way, a local increase in the $B_1$ field relative to the other areas of the object to be examined may be achieved (e.g., taking into account the RF exposure limits for the patient) in order, for example, to compensate for shading that was unavoidable with the previous measuring methods used in many examinations. A typical example of this is an examination using an arterial spin labeling method. In such cases, it is known to be difficult to achieve a sufficient amount of magnetization in a transversal image of the femoral aorta at the height of the hip bone, since, at these points, there is anatomy-induced shading of the $B_1$ field. With the method, in the context of B1 shimming, transmit scaling factors may be defined such that the $B_1$ field maximum value is increased locally in the desired area. Consequently, the $B_1$ performance may also be precisely increased in this area in order to obtain sufficiently good images or measured values. Since this involves a local increase of the $B_1$ field, the requirements for homogeneity at least in this local area or the radio-frequency exposure value may also be slightly reduced. It is automatically possible, as described above, to take account of these criteria in the boundary condition function in order to prevent deviations beyond a tolerable degree.

The method has significant strengths even when used with simple 2-channel systems, with which, for example, a birdcage antenna is only provided with two feeding points positioned at 90° to one another, as is nowadays the case in many existing systems in hospitals. Therefore, the minor slight modifications enable significant improvements to be achieved even with such systems. However, the number of transmit channels is not restricted. For example, one or more of the present embodiments may also be used in conjunction with other antenna systems (e.g., local coil arrangements).

DETAILED DESCRIPTION

Figure 1:
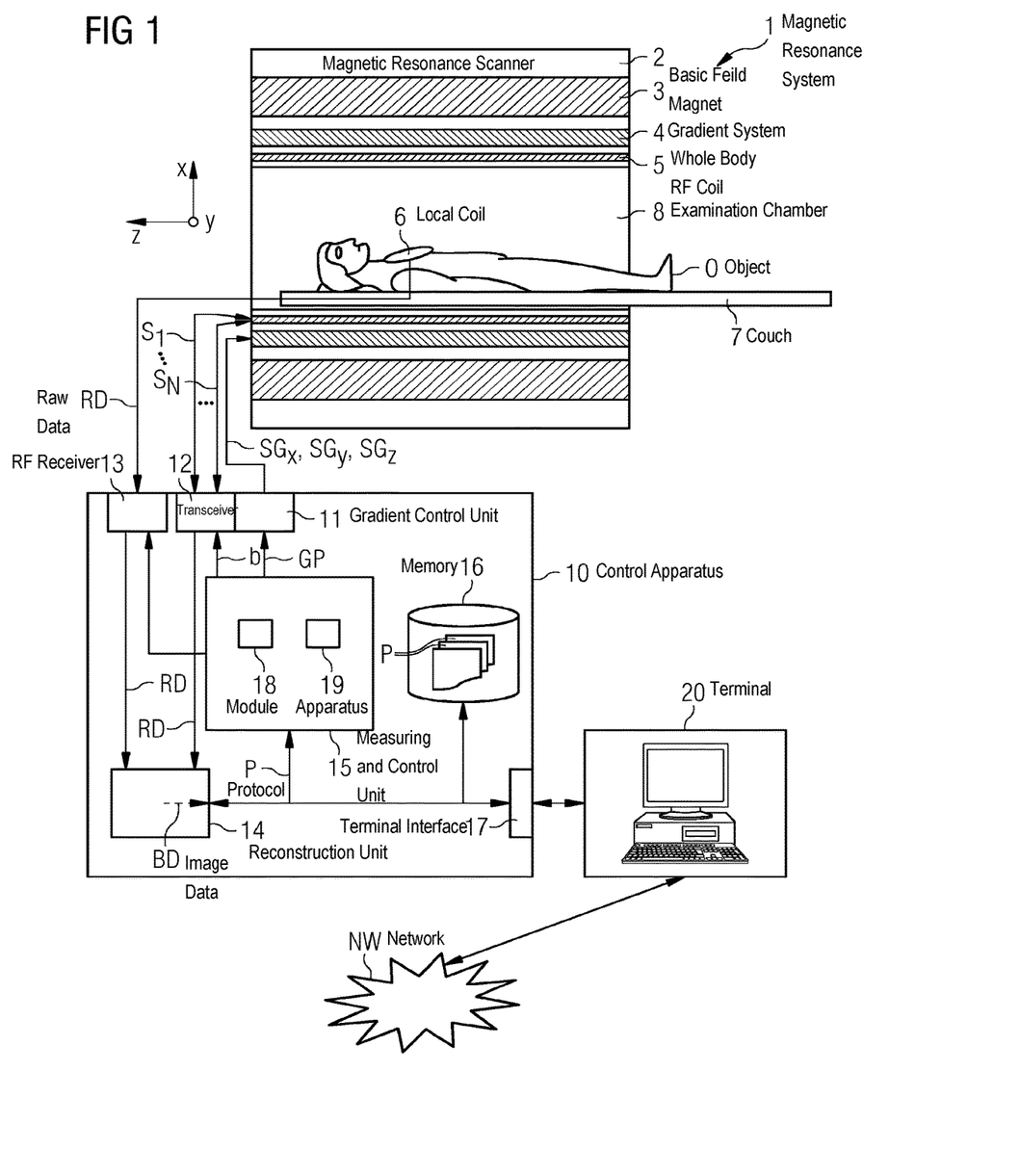
FIG. 1 shows an exemplary embodiment of a magnetic resonance system.

FIG. 1 shows one embodiment of a magnetic resonance system 1. The magnetic resonance system 1 includes an actual magnetic resonance scanner 2 with an examination chamber 8 or patient tunnel 8 contained in the actual magnetic resonance scanner 2. A couch 7 may be conveyed into this patient tunnel 8 so that, during an examination, a patient O or test subject lying on the couch 7 may be mounted at a specific position inside the magnetic resonance scanner 2 relative to the magnetic system and radio-frequency system arranged in the magnetic resonance scanner 2 or also be moved between different positions during a measurement.

Components of the magnetic resonance scanner 2 are a basic field magnet 3, a gradient system 4 with magnetic field gradient coils in order to apply any magnetic field gradients in the x-, y- and z-directions and a whole body radio-frequency coil 5. Reception of magnetic resonance signals induced in the object to be examined O may take place via the whole body coil 5, with which the radio-frequency signals for inducing the magnetic resonance signals are also transmitted. These signals may also be received, for example, by local coils 6 located on or under the object to be examined O. All these components are known to the person skilled in the art and are therefore only shown as a simple representation in FIG. 1.

The whole body radio-frequency coil 5 has the form of a birdcage antenna and has a number N of individual antenna rods that extend parallel to the patient tunnel 8 and are arranged in a uniform distribution around the circumference of the patient tunnel 8. End faces of the antenna rods are each connected in a capacitive manner in a ring.

The antenna rods may be controlled as individual transmit channels $S_1, \ldots, S_N$ separately by a control apparatus 10. The control apparatus 10 may be a control computer that may also include a plurality of individual computers (e.g., spatially separate and connected to one another by suitable cables or the like). The control apparatus 10 is connected by a terminal interface 17 to a terminal 20, via which an operator is able to control the entire system 1. As a computer, this terminal 20 is equipped with a keyboard, one or more screens and further input devices such as, for example, a mouse or the like so that the operator has a graphical user interface at his or her disposal.

The control apparatus 10 includes, for example, a gradient control unit 11 that may include a plurality of sub-components. The gradient control unit 11 connects the individual gradient coils to control signals $SG_x$, $SG_y$, $SG_z$. These are gradient pulses that are set during a measurement at precisely defined temporal positions and with a precisely pre-specified temporal course.

The control apparatus 10 also has a radio-frequency transceiver 12. The RF transceiver 12 also includes a plurality of sub-components in order to issue radio-frequency pulses in each case separately and parallel on the individual transmit channels $S_1, \ldots, S_N$ (e.g., on the individually controllable antenna rods of the whole body radio-frequency coil 5). The transceiver unit 12 is also able to receive magnetic resonance signals. However, this may be performed with the aid of the local coils 6. The signals received with these local coils 6 are read and processed by a RF receiver 13. The magnetic resonance signals received thereby or by the whole body coil using the RF transceiver 12 are transferred as raw data RD to a reconstruction unit 14 that constructs the image data BD from the raw data RD and stores the image data BD in a memory 16 and/or transfers the image data BD via the interface 17 to the terminal 20 so that the operator is able to view the image data BD. The image data BD may also be stored and/or displayed and evaluated via a network NW at other locations.

The gradient control unit 11, the radio-frequency transceiver 12 and the receiver 13 for the local coils 6 are each controlled in a coordinated manner by a measuring and control unit 15. This provides, by corresponding commands, that a desired gradient pulse train GP is emitted by suitable gradient control signals $SG_x$, $SG_y$, $SG_z$ and in parallel controls the RF transceiver 12 such that a multi-channel pulse train b is emitted (e.g., that the appropriate radio-frequency pulses are emitted on the individual transmit channels $S_1, \ldots, S_N$ in parallel on the individual transmit rods of the whole body coil 5). At the appropriate time, the magnetic resonance signals at the local coils 6 are to be read and further processed by the RF receiver 13, or any signals at the whole body coil 5 are to be read and further processed by the RF transceiver 12. The measuring and control unit 15 sends the corresponding signals (e.g., the multi-channel pulse train b) to the radio-frequency transceiver 12 and sends the gradient pulse train GP to the gradient control unit 11 as a function of a control sequence specified in a control protocol P. The control protocol P includes control data to be set during a measurement.

In one embodiment, a plurality of control protocols P for different measurements are stored in a memory 16. The plurality of control protocols may be selected via the terminal 20 by the operator and optionally varied in order to have available an appropriate control protocol P for the measurement currently desired, with which the measuring and control unit 15 may work. Otherwise, the operator may also retrieve control protocols P, for example, from a manufacturer of the magnetic resonance system 1 via a network NW and optionally modify and use the control protocols P.

The basic sequence of a magnetic resonance measurement of this kind and the named components for the control are, however, known to the person skilled in the art and will not be discussed in detail any further. Otherwise, a magnetic resonance scanner 2 of this kind and the associated control apparatus 10 may also have a plurality of further components that are also not explained in detail below.

The magnetic resonance scanner 2 may also have a different design, for example, with a side-opening patient chamber. The antenna arrangement used for the transmission may not be designed as a birdcage antenna. The antenna arrangement has a plurality of transmit channels $S_1, \ldots, S_N$, (e.g., two transmit channels) that may be controlled separately.

The measuring and control unit of the control apparatus includes, for example, in the form of software modules, a reference pulse generation module 18 that initially generates a reference pulse train $b_R$ according to the specifications in the control protocol P, which is to be utilized in a way matching the gradient pulses. This reference pulse train $b_R$ is initially sent to a pulse optimization apparatus 19 that may also be configured as a software module within the measuring and control unit 15. This pulse optimization apparatus 19 is used to determine an individual complex transmit scaling factor $SF_1, \ldots, SF_N$ in an RF pulse optimization method or $B_1$ shimming-method for each of the radio-frequency transmit channels $S_t, \ldots, S_N$.

Figure 2:
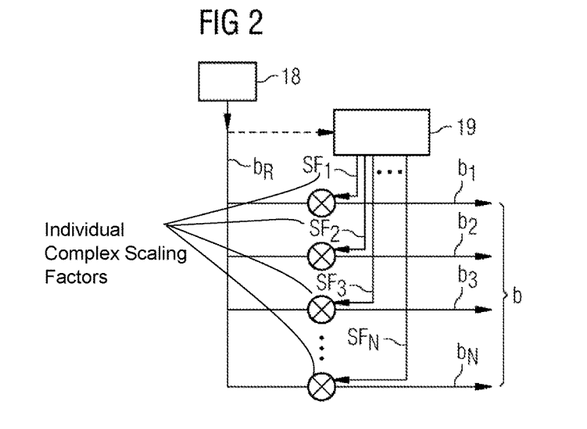
FIG. 2 illustrates an exemplary $B_1$ shimming.

FIG. 2 is another schematic view of one embodiment of a $B_1$ shimming-method or RF pulse optimization method. As shown in FIG. 2, the reference pulse train $b_R$ is sent to the pulse optimization apparatus 19, which, as explained below with reference to FIG. 3, determines the complex transmit scaling factors $SF_1, SF_2, SF_3 \ldots, SF_N$. As shown schematically, the complex transmit scaling factors $SF_1, SF_2, SF_3 \ldots, SF_N$ are multiplied by the reference pulse train $b_R$ in order to obtain the individual pulse trains $b_1, b_2, b_3, \ldots, b_N$, which then jointly form the multi-channel pulse train b that is emitted via the radio-frequency transceiver 12.

Alternatively, the pulse optimization apparatus 19 may, for example, also be constructed separately from the measuring and control unit 15 or be part of the radio-frequency transceiver 12 so that, for example, the multiplication with the complex transmit scaling factors $SF_1, SF_2, SF_3 \ldots, SF_N$ is performed by hardware (e.g., one or more processors). The reference pulse generation module 18 may also be a separate apparatus or, for example, part of the radio-frequency transceiver 12. However, the basic principles of a $B_1$ shimming method of this kind and the corresponding apparatuses are known to the person skilled in the art.

With one embodiment of the method, the RF pulse optimization may be performed in at least two different optimization modes $OM_1$, $OM_2$. In both cases, the transmit scaling factors ($SF_1, \ldots, SF_N$) are optimized taking into account a component-induced $B_1$ field maximum value ($<B_1>_{max}$) that is dependent on the transmit scaling factors ($SF_1, \ldots, SF_N$).

This is explained in more detail with reference to FIG. 3. The optimization method starts in act I with the input of an optimization mode indicator OMI. This may, for example, be performed by an operator via the terminal 20 to start a measurement or when the operator calls up a protocol P and matches the protocol P to the current measurement. Alternatively, this optimization mode indicator OMI may also be already stored as a value in the control protocol P and may then, for example, be changed if the operator so desires.

In act II, it is decided on the basis of this optimization mode indicator OMI whether the optimization method is to be performed in the first optimization mode $OM_1$ or in the second optimization mode $OM_2$.

In the first optimization mode $OM_1$, acts III.1 and IV.1 are executed. In the second optimization mode, acts III.2 and IV.2 are executed. In the context of these acts, in each case, a target function $f_Z$ and a boundary condition function $f_C$ that are subsequently used in a conventional way in act V in order to determine the optimum transmit scaling factors $SF_1, \ldots, SF_N$, are defined. A conventional constrained solver such as, for example, the solver fmincon from The Mathworks Inc described in the introduction may be used in act V.

The pulse optimization apparatus may also be configured such that any further optimization modes may be provided. The optimization mode indicator OMI may correspondingly also specify other optimization modes and, in act II, branching into further optimization modes is to take place (not shown in FIG. 3). This may also include optimization modes in which the $B_1$ performance is not taken into consideration in order to deactivate the method for cases in which the method is not required. Any other combinations of previously known optimization methods may also be provided.

If the first optimization mode $OM_1$ is selected, a target function $f_z$ with which the $B_1$ field maximum value is maximized locally is used. The target function may be used according to the above-defined Equation (4).

The $B_1$ field maximum value $<B_1>_{max}$ may, for example, be determined according to the following equation:

$$\langle B_1 \rangle_{max} = \left\{ \sum_{c=1}^{N} E_c(r) \cdot (\min\{U_{max}^1, U_{max}^2, U_{max}^3, \ldots \} \cdot SF_c) \right\} \quad (5)$$

$E_c(r)$ is the sensitivity matrix (in µtesla/volt), $SF_c$ is the scaling factor of the transmit channel $c=1, \ldots, N$, and r is spatial pixel or voxel position (in mm), as already explained above in connection with Equation (4). The functions $U_{max}^i$, $i=1, 2, 3, \ldots$, are component protection model functions that represent in each case the maximum permissible voltage (in volt) at a specific transmit component in the transmit chain of the magnetic resonance system.

Figure 4:
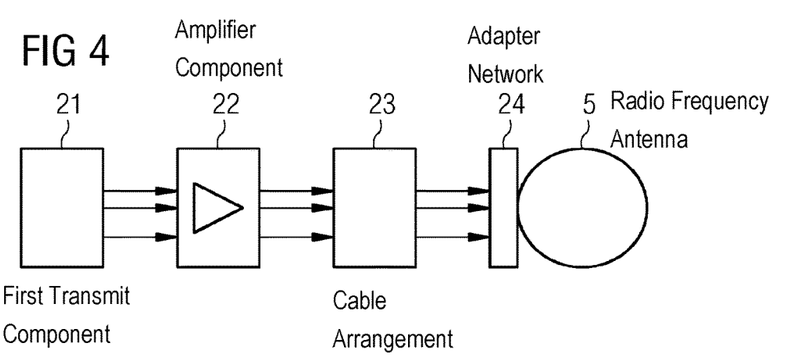
FIG. 4 shows exemplary transmit components of a transmit chain of a magnetic resonance system.
Figure 5:
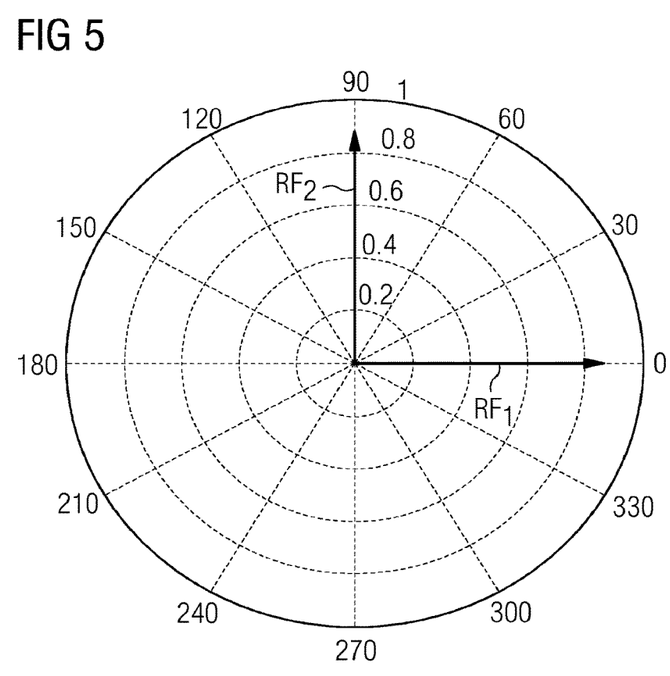
FIG. 5 shows an exemplary polar vector representation of two RF coefficients for the two RF pulses that are fed into a birdcage antenna with two feeding points positioned at 90° to one another in a CP mode.
Figure 6:
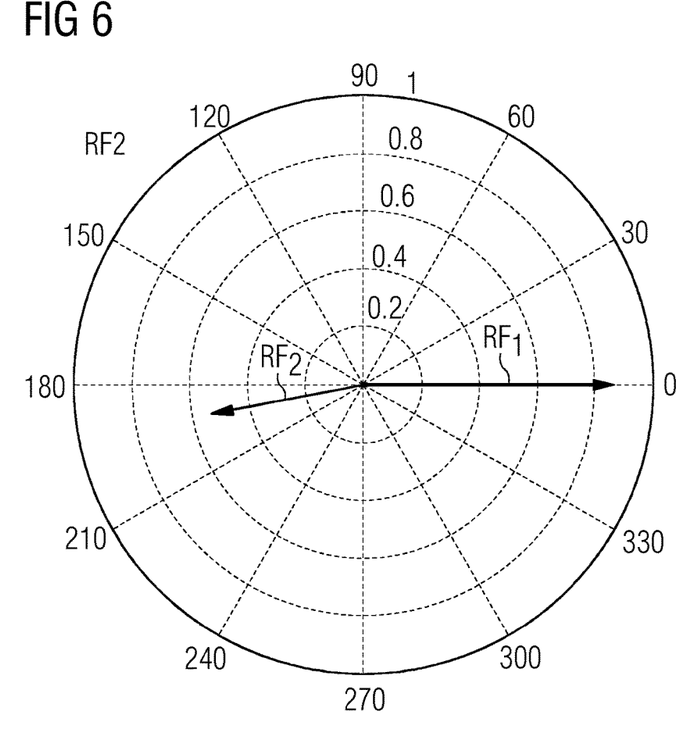
FIG. 6 shows an exemplary polar vector representation of two RF coefficients as shown in FIG. 5, where the complex transmit scaling factors of the RF pulses have been changed in a B1 shimming-method.

To illustrate this approach, reference is made to FIG. 4. FIG. 4 shows a simplified block diagram of an example of a transmit chain of a magnetic resonance system. In a first transmit component 21, shown as a block, that may also include the reference pulse generation unit 18 and the RF pulse optimization unit 19, as explained with reference to FIG. 2, a multi-channel pulse train b with a plurality of individual RF pulse trains $b_1, b_2, b_3, \ldots, b_N$ is generated and, for example, still with a reduced voltage. The RF pulse trains $b_1, b_2, b_3, \ldots, b_N$ are sent to an amplifier component 22 with N different amplifier channels corresponding to the number N of transmit channels. The amplified radio-frequency pulses are fed via a cable arrangement 23 and via an adapter network 24 into the radio-frequency antenna 5 (e.g., the individual antenna elements of the birdcage 5). All these transmit components 22, 23, 24 (e.g., for the individual amplifier channels of the amplifier component 22 for the cables of the cable arrangement 23 and for the channels in the adapter network 24) are subject to specific limits with respect to the maximal permissible voltage pulses on the individual channels, which are represented by the component protection model functions in Equation (5). These component protection model functions may be dependent upon the scaling factors. In other words, the following applies:

$$U_{max}^1 = f(SF) \quad (6)$$

where SF is again the vector of the transmit scaling factors $SF_c$. f is a function describing the dependencies. This dependency exists, for example, because the transmit scaling factors $SF_c$ are complex factors that change not only the amplitudes relative to one another but also the phases. For example, the phase displacement may result in a significantly higher voltage being present between two adjacent transmit channels within one of the TX components 22, 23, 24 of the transmit chain than the maximum voltage emitted on the individual transmit channels. This is illustrated with reference to FIGS. 5 and 6.

FIG. 5 shows the coefficients or relative fractions $RF_1$, $RF_2$ of a 2-channel RF pulse in a polar coordinate system. The 2-channel RF pulse is, for example, emitted on two transmit channels of a two-channel system with a birdcage with two feed-in points. In FIG. 5, the pulses are sent in CP mode. In other words, pulses with the same amplitude responses with the same maximum amplitude are emitted on the two channels. The pulses are phase-shifted by 90°. In the diagram in FIG. 5, the maximum voltage amplitude is in each case represented by the radial length of the vector of the coefficients $RF_1$, $RF_2$, the phase is represented by the angle between the two vectors.

FIG. 6 shows an exemplary effect of the phase displacement on the maximum differential voltage $\Delta U$. Unlike the case in the example in FIG. 5, the transmit scaling factors on the two transmit channels have been freely chosen so that, although the maximum amplitude on one of the two transmit channels (e.g., the amplitude of the vector $RF_2$) is reduced compared to the other vector $RF_1$, the phase displacement is no longer 90. Instead, the phase displacement is approximately 190° so that despite the reduction in amplitude, there is a greater differential voltage vector $\Delta U$ between the two channels. This simple example shows very clearly the effects of the complex transmit scaling factors on the voltage differences that occur in the individual TX components 22, 23, 24 between the individual transmit channels.

The component protection model functions $U_{max}^i$, i=1, 2, 3, . . . , may be determined in a different way. In one embodiment, $U_{max}^i$ may be determined as follows for the i-th component:

$$U_{max}^i = \frac{\max_c(|b_c|)}{d^i} \cdot \text{limit}^i \tag{7}$$

$b_c$ is the voltage amplitude on the channel c=1, N (N=number of channels) at any time n (e.g., $b_c = SF_c \cdot b_R$ where $b_R$ is the voltage amplitude of the reference pulse train at any time n). $\max_c(|b_c|)$ is the maximum value of all voltage amplitudes on the channels c (e.g., the voltage maximum over all channels at any time n).

$d^i$ is a limiting vector (e.g., subconstraint vector) with K vector elements $d_k^i$, k=1, . . . , K. The number K depends upon the hardware modeling used and may have a value corresponding to the value 1 or a value corresponding to the number of channels (i.e. K=N). These vector elements $d_k^i$ may be defined as follows:

$$d_k^i = L^i \cdot M^i \cdot \begin{pmatrix} 0 \\ b_c \end{pmatrix} \tag{8}$$

$L^i$ is the combination matrix of the respective component i and has a value of K×2N. If N=2 (e.g., for a system with two channels), and K=N, $L^i$ may, for example, be:

$$L^i = \begin{pmatrix} 1 & 0 & 1 & 0 \\ 0 & 1 & 0 & 1 \end{pmatrix} \tag{9}$$

$M^i$ is the wave-chain matrix, which describes the hardware component i. The size of $M^i$ is 2N×2N, where N is the number of channels.

The vector on the far right-hand side in Equation (8) has as upper N entries with the value 0 and underneath a vector portion including the N values $b_e$ as explained above with respect to Equation (7). The 0-vector stands for the returning wave (e.g., at the input to the RF transmit chain) and the known partial vector $b_e$ for the advancing wave.

The following applies for the limits to be observed, for example:

$$|d^i| < \text{limit}^i \tag{10}$$

where the value $\text{limit}^i$ is, for example, defined in each case by the maximum permissible voltage or another suitable value (e.g., the maximum permissible magnetic field) of the respective hardware component i. In this simple case, therefore, the absolute value of the sum of the advancing and returning waves may in each case be limited individually for each channel.

As Equation (5) shows, the $B_1$ field maximum value $<B_1>_{max}$ is also dependent upon the location r. This provides that it is correspondingly possible to perform local optimization for specific pixels or voxels within the entire area examined. A region of interest ROI may, for example, be initially entered. This may, for example, be performed by an operator with the aid of a graphical user interface that inscribes the corresponding region, ROI, in an image from a previous measurement. The region of interest ROI of this kind may also be defined with automatic methods.

Figure 3:
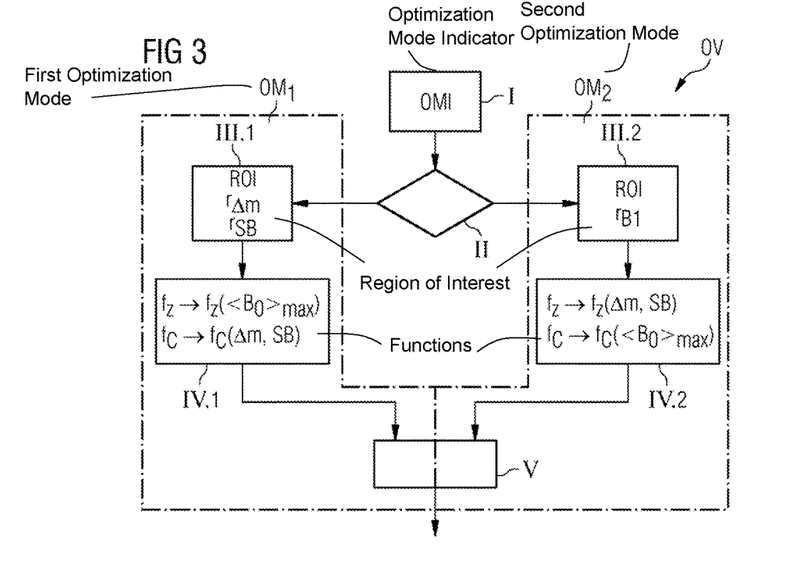
FIG. 3 shows a flowchart of one embodiment of a method.

The region of interest ROI may be determined within the optimization mode $OM_1$ before the definition of the target function $f_z$ in act III.1 (see FIG. 3). Further parameters may also be determined in act III.1 (e.g., a relation value $r_{\Delta m}$), which indicates the degree (e.g., the percentage) with which the result of the optimization method may correspond to a target magnetization deviation $\Delta m$ that may be achieved with a measurement with a basic excitation mode for the respective examination (e.g., in a CP mode or an EP mode). This relation value $r_{\Delta m}$ may be used in act IV.1 to establish the boundary condition function $f_C$ on the basis of the target magnetization deviation. In addition, a relation value $r_{SB}$ may also be acquired in order to use this relation value $r_{SB}$ in act IV.1 to generate a boundary condition function $f_C$ on the basis of the radio-frequency exposure.

The precise formulation of the boundary condition functions $f_C$ in act IV.1 may, for example, be performed as follows, An example of a boundary condition function $f_C(\Delta m)$ that is dependent on the target magnetization deviation $\Delta m$ may be defined by the function $$\||A \cdot b| - |m|\|^2 < r_{\Delta m} \cdot \||A \cdot b| - |\|^2_{CP/EP} \tag{11}$$

The left-hand side of the inequation indicates the target magnetization deviation value $\Delta m = \||A \cdot b| - |m|\|^2$ that may be achieved with the transmit scaling factors currently calculated in the optimization. This may be smaller than the target magnetization deviation value $\Delta m = \||A \cdot b| - |m|\|^2_{CP/EP}$ achievable in a basic excitation mode (e.g., in CP mode or EP mode), multiplied by the relation value $r_{\Delta m}$.

The function term for the basic excitation (e.g., CP mode or EP mode) is indicated in Equation (11) and in the following, by the lower index CP/EP. Instead of an inequation, an equation may be selected (e.g., the optimization is performed), such that the target magnetization deviation value achieved is exactly the target magnetization deviation value in the CP or EP mode multiplied by the relation value $r_{\Delta m}$.

In addition, the RF exposure may be taken into account within a boundary condition function $f_C(SB)$. A specific boundary condition function may be:

$$\left( \sum_{c=1}^{N} \sum_{c'=1}^{N} ZZ_{hcc'} \cdot T_{cc'} \right) < r_{SB} \cdot \left( \sum_{c=1}^{N} \sum_{c'=1}^{N} ZZ_{hcc'} \cdot T_{cc'} \right)_{CP/EP} \tag{12}$$

This boundary condition function corresponds to a monitoring of a local exposure vector $SED_{loc}$ (e.g., of a local exposure vector of the local SED values $SED_{loc,h}$ (in [Ws/ kg])). These local SED values $SED_{loc,h}$ may be calculated at a virtual observation point (VOP) h in the body of the object to be examined O using the following equation:

$$SED_{loc,h} = \sum_{c=1}^{N} \sum_{c'=1}^{N} ZZ_{hcc'} \cdot T_{cc'} \qquad (13)$$

N is the number of independent transmit channels, and c and c' are control variables, extending from 1 to N (N=number of transmit channels). The values $ZZ_{hcc'}$ are the individual elements of a sensitivity matrix ZZ. In Equation (13), this sensitivity matrix ZZ includes a sensitivity value for each VOP h, which, multiplied with the amplitude of the RF field, represents the E field in the VOP in question and forms a conversion factor from the amplitude of the radio-frequency curve to the actual energy load in the VOP. This provides that, when 30 such VOPs are observed, the RF local exposure vector $SED_{loc}$ includes 30 vector elements according to Equation (13).

$T_{cc'}$ is the cross correlation of the RF curves of the RF pulse train:

$$T_{cc'} = \Delta t \cdot \sum_{c=0}^{N} conj(b'_c) \cdot b_c \qquad (14)$$

$\Delta t$ is the sampling interval in s. This cross correlation indicates whether the RF curves of the RF pulse train are amplified or reduced at a specific location during the superimposition.

Like further elements or parameter values of the target functions and boundary condition functions, the sensitivity matrix ZZ may also, for example, be stored in a memory 16 of the control apparatus 10. From the memory 16, the sensitivity matrix ZZ may be called up when required. The sensitivity matrix ZZ may, for example, be determined in advance by simulations on body models. One method for determining a sensitivity matrix of this kind and the local SED values $SED_{loc}$ is, for example, described in 2010/0308825, the full content of which is incorporated by reference. Different sensitivity matrices may be stored for different body types (e.g., patients of different sizes). For further explanations, reference is made again to 2011/0254545, which also uses the local exposure vector.

The boundary condition function according to Equation (14) does not use a norm of local SED values of the local exposure vector $SED_{loc}$ (e.g., the VOPs) specified by the sensitivity matrix $ZZ_{hcc'}$ and the cross correlation $T_{cc'}$. Instead, the maximum of the individual VOPs is taken into account (e.g., monitoring is performed to determine whether the prespecified maximum is not undershot at the VOP with the greatest local exposure). The left-hand side indicates the maximum of the local exposure vector achieved with the optimized transmit scaling factors, and the right-hand side (indicated by the lower index CP/EP) indicates the maximum, as achieved with the conventional CP or EP transmit mode, multiplied by the relation value $r_{SB}$. An equation may be used instead of the inequation.

In one embodiment, in the context of the boundary condition function, any norm of the local SED values of the local exposure vector $SED_{loc}$ may be taken into account. For example, the Euclidean norm $\|SED_{loc}\|^2$ may be used in order to limit the local SED exposure or the squared maximum norm $\max^2(SED_{loc})$ in order to keep the critical maximum of the local SED vector under or at a specific value.

If the target function $f_z$ and the boundary condition functions $f_c$ are defined in act IV.1, an optimization of the scaling function may be performed in the conventional manner in act V.

If in act I (in FIG. 3) an optimization mode indicator OMI corresponding to the second optimization mode $OM_2$ is selected, initially in act III.2, only a region of interest ROI is acquired in order, on this basis later in act IV.2, to define the boundary condition function as a function of the $B_1$ field maximum value $<B_1>_{max}$. The determination of the region of interest ROI may be performed in the first optimization mode $OM_1$ as in act III.1.

In act IV.2, initially a target function $f_z$ is defined. The target function $f_z$ is a function of the target magnetization deviation $\Delta m$ and/or an RF load value SB. The target function may, for example, be constructed as follows:

$$SF = \arg_{SF} \min \{\alpha \| |A \cdot b| - |m| \|^2 + \beta \cdot f(SED_{loc})\} \qquad (15)$$

The factors $\alpha$ and $\beta$ in Equation (15) are optional weighting factors with which either the target magnetization deviation $$\Delta m = \| |A \cdot b| - |m| \| \qquad (16)$$

or the radio-frequency exposure, which is described by a local exposure function term $f(SED_{loc})$ is more greatly taken into account. If, for example, $\alpha=0$ is set, only an optimization with respect to the of the radio-frequency exposure value is performed. If $\beta=0$ is set and $\alpha=1$, only optimization with respect to the target magnetization deviation $\Delta m$ is performed. Since the target magnetization deviation $\Delta m$ relates to how well the magnetization achieved is matched to the desired target magnetization, this involves an image quality criterion. A comparison with Equation (1) shows that, in this case, the target function corresponds to the conventional target function. Any combination desired may be set.

The local exposure function term $f(SED_{loc})$ in Equation (15) may be embodied in different ways. In one embodiment, $f(SED_{loc}) = \|SED_{loc}\|^2$ is set. This has the result that RF energy is withdrawn from the more critical VOPs in the list, and energy is supplied to other non-critical VOPs. Due to the use of the squared norm $\| \|^2$ overall during the optimization, minimization of the squared interval of the local SED vector to the zero point is achieved. Alternatively, this may involve the squared maximum norm $\max^2(SED_{loc})$. This results in the critical maximum of the local SED vector being minimized.

In the second optimization mode $OM_2$, the $B_1$ field maximum value $<B_1>_{max}$ is taken into account in the boundary condition function $f_c$. For example, similarly to equations (11) and (12), a boundary condition function may be set for the definition of a boundary condition that takes account of the target magnetization deviation $\Delta m$ and/or the RF load value SB, in which it is specified that the $B_1$ field maximum value is to be above or equal to a specific reference maximum value. An example of this is $$\langle B_1 \rangle_{max} \geq r_{B1} \cdot \langle B_1 \rangle_{max,CP/EP} \qquad (17)$$

Equation (17) defines, for example, that the optimization of the transmit scaling factors may be performed such that the component-induced $B_1$ field maximum value $<B_1>_{max}$ is greater than or equal to the $B_1$ field maximum value $<B_1>_{max,CP/EP}$ without optimization of the transmit scaling factors (e.g., in a CP or EP mode, multiplied by with a relation value $r_{B1}$). If, for example, this relation value $r_{B1}=1$ is set, this provides that, although optimization of the transmit scaling factors with respect to the target magnetization deviation Δm and/or the radio-frequency exposure SB takes place within the second optimization mode, it is simultaneously provided that the $B_1$ performance is no worse than with a conventional transmit mode without optimization of the transmit scaling factors (e.g., than in the CP or EP mode).

FIGS. 7 to 10 show comparative images for measurements in a sagittal slice through the head of a test subject that were performed with a simple two-channel system (e.g., with a birdcage antenna with two feed-in points). In this context, in the $B_1$ shimming-method, the transmit scaling factors may be set optionally for the two transmit channels. In each case, the $B_1$ field distributions are shown within a slice in the form of a conventional $B_1$ map of this slice. The $B_1$ values are each shown for the pixels in question in the form of a grey-scale value corresponding to adjacent scale bar. In each case, the coordinate axes indicate the position in the slice in question in mm.

Figure 7:
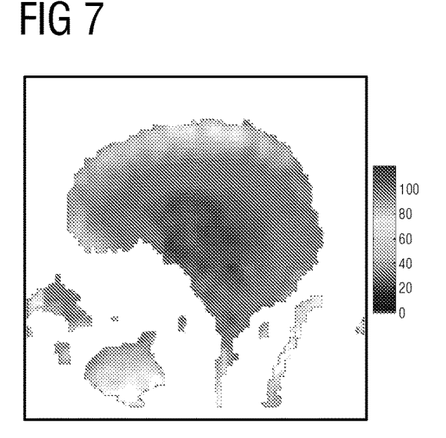
FIG. 7 shows an exemplary image of a $B_1$ field distribution in a sagittal sectional view through the head of a test subject on an emission of RF pulses in a standard CP mode in a simple 2-channel system.

FIG. 7 shows a $B_1$ map generated with the original scaling factors in a standard CP mode (e.g., a phase displacement of 90° and an amplitude ratio of 1). Since this involves images in the head region, in each case, the circularly polarized CP mode is used as a comparison, since this is the standard mode for examinations in the head region. The $B_1$ field maximum value is, for example, 22.1 μtesla.

Figure 8:
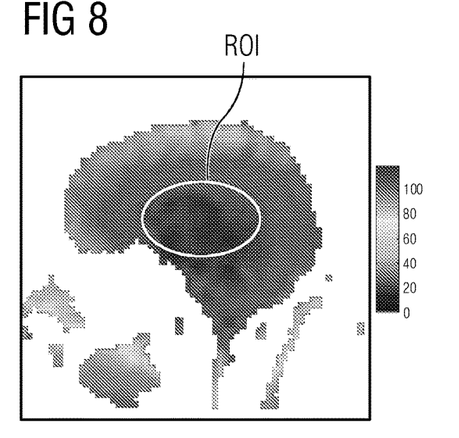
FIG. 8 shows an exemplary image of the $B_1$ field distribution as shown in FIG. 7 following optimization of a $B_1$ performance in a prespecified region of interest.

FIG. 8 shows a $B_1$ map of the same sagittal slice, where, however, optimization of the $B_1$ performance according to the first optimization method (e.g., with a target function according to Equation (4)) of 10% m is performed. This optimization is restricted to the region of interest ROI delimited by the black ellipsis in FIG. 8. Within the region of interest ROI, the optimization method achieved a $B_1$ field maximum value of 24.4 μTesla corresponding to a $B_1$ performance of 110.4%, relative to the conventional method according to FIG. 7. As a result, since it is only defined at a prespecified acceptable value in the boundary condition function, the target magnetization deviation has deteriorated by 7.2%, and the local radio-frequency exposure, which is also only taken into account in the boundary condition function, has reduced by 3.8%. The global radio-frequency exposure has increased by 0.4%.

Figure 9:
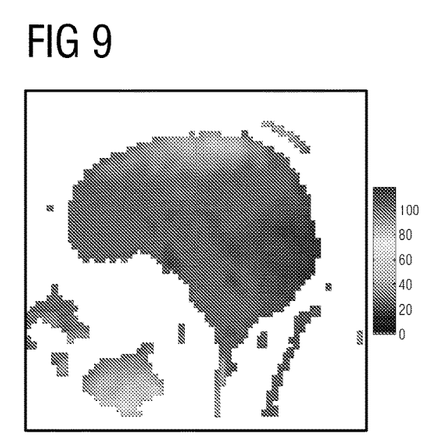
FIG. 9 shows an exemplary image of the $B_1$ field distribution as shown in FIG. 7 in accordance with a conventional optimization with respect to the homogenization of the $B_1$ field distribution.
Figure 10:
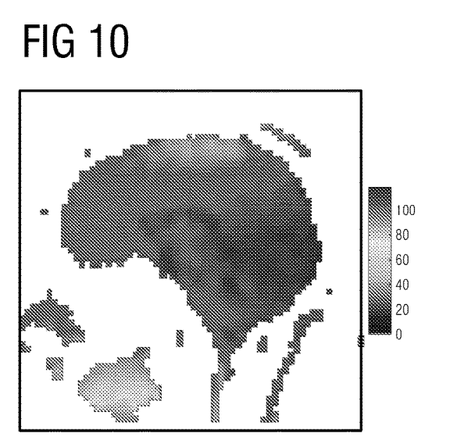
FIG. 10 shows an exemplary image of the $B_1$ field distribution as shown in FIG. 9 with an additional increase in the $B_1$ performance in a prespecified region of interest using a boundary condition function during the optimization.

FIGS. 9 and 10 both show $B_1$ maps through the same sagittal slice of head as in FIGS. 7 and 8. These images were taken in order to demonstrate the effect of taking account of the $B_1$ field maximum value within a boundary condition function.

FIG. 9 shows the $B_1$ map according to a conventional $B_1$ shimming taking sole account of the $B_1$ homogenization, without the component protection limits being taken into account during the B1 shimming (e.g., during the RF pulse optimization method), in that attention is paid to the $B_1$ field maximum value. A solution is found for the scaling factors, which, although the solution is ideal with respect to the $B_1$ homogeneity and radio-frequency exposure, results in extremely large voltages due to high phase differences between the channels. The amplitudes are therefore scaled down later in the measuring system. This has the result that the actual optimized flip angle is not reached in reality. In the example according to FIG. 9, this conventional method achieves a 36% improvement in homogeneity compared to a conventional circularly polarized mode such as that shown in FIG. 7. This is shown due to the more uniform distribution compared to FIG. 7. With respect to the radio-frequency exposure, the following increases were accepted: local RF exposure 47.8%, global RF exposure 30.7%.

Since, however, the $B_1$ performance is not taken into account, the optimization resulted in the $B_1$ field maximum value lying at only 12.3 μtesla, which corresponds to a $B_1$ performance of 55.7% compared to a conventional CP mode.

FIG. 10 shows a $B_1$ map produced after optimization with a target function, where the target magnetization deviation (e.g., the homogeneity) and the radio-frequency exposure is taken into account during the optimization in the same way as in FIG. 9. In the context of the optimization, it is required by a boundary condition function that the $B_1$ performance is not to be more than 80% below the $B_1$ performance of a typical CP mode. According to this boundary condition, in the optimization method, the transmit scaling factors are also defined such that a $B_1$ field maximum value of 17.7 μTesla that corresponds to 80% of the original value in the CP mode is achieved. The target magnetization deviation (e.g., the homogeneity) is improved by 31.8%. The following values are, for example, achieved with respect to the radio-frequency exposure: local RF increase 4.0%, global RF reduction 11.9%.

These examples show how the method may be used significantly to improve the $B_1$ performance.

The detailed methods and structures described above are exemplary embodiments, and the basic principle may also be varied by the person skilled in the art in wide areas without departing from the scope of the invention, as defined by the claims. The use of the indefinite article "a" does not exclude the relevant features also being present in a greater number. The terms "unit" and "module" do not exclude the possibility of these including a number of components that may optionally also be distributed spatially.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for controlling a magnetic resonance system comprising a plurality of radio-frequency transmit channels via which, in operation, parallel RF pulse trains are transmitted, the method comprising:
   specifying a common reference pulse train for the plurality of radio-frequency transmit channels;
   determining, by a pulse optimization apparatus, a transmit scaling factor for each radio-frequency transmit channel of the plurality of radio-frequency transmit channels in an RF pulse optimization method, taking into account a prespecified target magnetization, in order to calculate the parallel RF pulse trains for the plurality of radio-frequency transmit channels on the basis of the specified common reference pulse train; and transmitting, by a control apparatus, the parallel RF pulse trains for the plurality of radio-frequency transmit channels, wherein the transmit scaling factors are optimized taking into account a component-induced $B_1$ field maximum value that is dependent upon the transmit scaling factors.

2. The method as claimed in claim 1, wherein the determining comprises creating, in the RF pulse optimization method, during the determination of the transmit scaling factors, at least in a first optimization mode, a target function that includes the $B_1$ field maximum value.

3. The method as claimed in claim 1, wherein the transmit scaling factors are optimized such that the $B_1$ field maximum value is maximized.

4. The method as claimed in claim 2, wherein the creating comprises creating the target function independently of a target magnetization deviation, independently of an RF load value of an object to be examined, or independently of the target magnetization deviation and the RF load value.

5. The method as claimed in claim 1, wherein a target magnetization deviation, RF load values of an object to be examined in the RF pulse optimization method, or the target magnetization deviation and the RF load values are taken into account by a boundary condition function.

6. The method as claimed in claim 2, wherein in the RF pulse optimization method, at least in a second optimization mode, the $B_1$ field maximum value is taken into account in a boundary condition function.

7. The method as claimed in claim 1, wherein the transmit scaling factors are optimized such that the $B_1$ field maximum value is at least equal to or greater than a specific reference maximum value.

8. The method as claimed in claim 6, further comprising acquiring an optimization mode indicator, the RF pulse optimization method being performed according to the first optimization mode, according to the second optimization mode, or according to a further optimization mode on the basis of the optimization mode indicator.

9. The method as claimed in claim 1, further comprising calculating the $B_1$ field maximum value using at least one component protection model function that represents a maximal permissible voltage for a transmit component of the magnetic resonance system.

10. The method as claimed in claim 1, further comprising calculating the $B_1$ field maximum value using position-dependent sensitivity distributions of the plurality of radio-frequency transmit channels.

11. The method as claimed in claim 1, further comprising calculating the $B_1$ field maximum value for a locally restricted area.

12. The method as claimed in claim 2, wherein the transmit scaling factors are optimized such that the $B_1$ field maximum value is maximized.

13. The method as claimed in claim 12, wherein the creating comprises creating the target function independently of a target magnetization deviation, independently of an RF load value of an object to be examined, or independently of the target magnetization deviation and the RF load value.

14. The method as claimed in claim 13, wherein in the RF pulse optimization method, at least in a second optimization mode, the $B_1$ field maximum value is taken into account in a boundary condition function.

15. The method as claimed in claim 6, wherein the transmit scaling factors are optimized such that the $B_1$ field maximum value is at least equal to or greater than a specific reference maximum value.

16. The method as claimed in claim 15, further comprising acquiring an optimization mode indicator, the RF pulse optimization method being performed according to the first optimization mode, according to the second optimization mode, or according to a further optimization mode on the basis of the optimization mode indicator.

17. The method as claimed in claim 2, further comprising calculating the $B_1$ field maximum value using at least one component protection model function that represents a maximal permissible voltage for a transmit component of the magnetic resonance system.

18. A pulse optimization apparatus for a magnetic resonance system comprising a plurality of radio-frequency transmit channels, the pulse optimization apparatus comprising:
a processor configured to determine, in a RF pulse optimization method, taking into account a prespecified target magnetization, a transmit scaling factor for a jointly specified reference pulse train for each radio-frequency transmit channel of the plurality of radio-frequency transmit channels,
wherein the transmit scaling factors are optimized taking into account a component-induced $B_1$ field maximum value that is dependent upon the transmit scaling factors.

19. A magnetic resonance system comprising:
a plurality of radio-frequency transmit channels;
a control apparatus configured to transmit parallel RF pulse trains in order to perform a desired measurement over the plurality of radio-frequency transmit channels; and
a pulse optimization apparatus configured to determine, in a RF pulse optimization method, taking into account a prespecified target magnetization, a transmit scaling factor for a jointly specified reference pulse train for each radio-frequency transmit channel of the plurality of radio-frequency transmit channels,
wherein the transmit scaling factors are optimized taking into account a component-induced $B_1$ field maximum value that is dependent upon the transmit scaling factors.

20. In a non-transitory computer-readable storage medium of a pulse optimization apparatus, a control apparatus, or a pulse optimization and control apparatus of a magnetic resonance system that stores instructions executable by one or more processors of the pulse optimization apparatus, the control apparatus, or the pulse optimization and control apparatus to control the magnetic resonance system, the instructions comprising:
specifying a common reference pulse train by the control apparatus for a plurality of the radio-frequency transmit channels;
determining, by the pulse optimization apparatus, the control apparatus, or the pulse optimization and control apparatus, a transmit scaling factor by the pulse optimization apparatus for each radio-frequency transmit channel of the plurality of radio-frequency transmit channels in an RF pulse optimization method, taking into account a prespecified target magnetization, in order to calculate the parallel RF pulse trains for the plurality of radio-frequency transmit channels on the basis of the specified common reference pulse train, wherein the transmit scaling factors are optimized taking into account a component-induced $B_1$ field maximum value that is dependent upon the transmit scaling factors.

* * * * *